United States Patent [19]

Carlo et al.

[11] 4,096,581
[45] Jun. 20, 1978

[54] EXTERNAL DRIVE COIL MAGNETIC BUBBLE PACKAGE

[75] Inventors: James Thomas Carlo, Richardson; Alvis Doyle Stephenson, Jr., Dallas, both of Tex.

[73] Assignee: Texas Instruments Incorporated, Dallas, Tex.

[21] Appl. No.: 714,545

[22] Filed: Aug. 16, 1976

[51] Int. Cl.² .............................................. G11C 19/08
[52] U.S. Cl. ..................................................... 365/2
[58] Field of Search .................................. 340/174 TF

[56] References Cited

U.S. PATENT DOCUMENTS 4,027,300  5/1977  Braun ............................ 340/174 TF

OTHER PUBLICATIONS

IEEE Transactions on Magnetics, vol. Mag-11, No. 5, 1975, pp. 1151–1153.

Primary Examiner—James W. Moffitt
Attorney, Agent, or Firm—James T. Comfort; Rene' E. Grossman; William E. Hiller

[57] ABSTRACT

A magnetic bubble domain package suitable for single or multiple chips in which the coil assembly for producing the rotating magnetic field necessary for bubble movement and logical operations to be performed on these chips comprises a pair of coils wound on a magnetic body in orthogonal relationship with respect to each other which is located external to said chip or chips in order to reduce coil size and power requirements. The package employs an open bias field magnet assembly which comprises an open-ended tubular housing constructed of shielding material and having permanent magnets mounted therein with soft magnetic plates disposed on the permanent magnets. An alternate embodiment employs only a single permanent magnet and a single soft magnetic plate secured within the tubular housing, and uses the magnetic body of the coil assembly as part of the bias field assembly. The chip substructure which is served by this bias field assembly employs a metal plate as an image current producer to increase the uniformity of the drive field. An interconnect member constructed of a thin film of insulating material with electrical conductors disposed thereon is used to provide the interface between the external signal leads of the package and the magnetic bubble domain chip.

12 Claims, 8 Drawing Figures

EXTERNAL DRIVE COIL MAGNETIC BUBBLE PACKAGE

BACKGROUND OF THE INVENTION

This invention relates to magnetic bubble domain packages, and, more particularly, to a magnetic bubble domain chip package in which the chip is external to the drive field coil assembly and the bias field is supplied by an open magnet assembly which produces an extremely uniform magnetic field while shielding the chip from stray magnetic fields external to the package.

As is well known in the art, magnetic bubble domain chips require two magnetic fields for proper operation. The first is a bias field which is essentially perpendicular to the surface of the magnetic bubble domain chip, the strength of this field controlling the size of the magnetic bubble domains on the chip. This field must be kept at a precisely uniform strength to keep the magnetic bubble domains at all points on the surface of the chip both the same size and in a non-volatile state. The other magnetic field is a rotating magnetic field which is produced in the plane of the magnetic bubble domain chip surface and which controls the movement of the magnetic bubble domains along the propagation and logic paths disposed on the surface of the chip.

The surface of a conventional magnetic bubble domain chip is composed of magnetizable material which has regions with magnetically easy directions of polarization essentially perpendicular to the planar surface of the chip. As the bias field strength is increased, these regions shrink to form the small localized regions of polarization known as magnetic bubble domains. Further increase in this field strength will further shrink the magnetic bubble domains and eventually make them unstable. The strength of the perpendicular magnetic bias field is thus of significant importance and a precise bias field strength is required to maintain the magnetic bubble domains at the proper size and in a non-volatile state. Stray magnetic fields in the operating environment of the magnetic bubble domain device could alter this field strength and adversely affect the proper operation of the device. Shielding of the magnetic bubble domain chip is therefore required, but this presents a problem in that convenient electrical access to the magnetic bubble domain chip must be acquired through the shielding means. It is also desirable to design a package which may be inexpensively assembled in a mass production environment while providing the packaging requirements unique to magnetic bubble domain devices.

One technique of controlling the movement of the magnetic bubble domains on the chip is to supply the aforementioned layer of magnetizable material on the surface of the magnetic bubble domain chip which supports the bubble domains with an overlay pattern of magnetic material along which the bubble domains are propagated. Propagation is achieved by means of the aforementioned rotating magnetic drive field in the plane of the magnetizable material. As this rotating drive field is re-oriented in its cycle of rotation, a bubble will be propagated along the overlay pattern on the surface of the chip. Provision of this rotating magnetic drive field is a significant problem in the packaging of the magnetic bubble domain chips. One method of providing the rotary magnetic field is to first wind an insulated electrically conductive coil around the chip and then to wind a second electrically conductive coil around and in orthogonal relationship to the first. These coils are then driven by electrical signals which are 90° out of phase with respect to each other, thus producing a rotating magnetic field in the plane of the bubble supporting magnetizable material of the magnetic bubble domain chip located inside the coils. A disadvantage of this scheme is that input and output leads to and from the magnetic bubble domain chip must pass through the coils, thus requiring the coils to be larger than is necessary for the production of the drive field. Larger coils require more power, and the location of the magnetic bubble domain chips within the coils presents a further disadvantage in that a limit to the number of chips which can be packaged is automatically set.

SUMMARY OF THE INVENTION

Briefly, a packaging assembly for a magnetic bubble domain device of this invention comprises a drive field coil assembly including a pair of coils wound around a magnetic body in orthogonal relationship with respect to each other and driven by electrical signals which are 90° out of phase with each other. The drive field coil assembly is external to the chip but produces a rotating magnetic field in the plane of the chip which is made more uniform by means of a metal plate acting as an image current producer. Since the chip is located external to the drive field coil assembly, the coils may be made smaller, input and output lead openings not being required. The result is a smaller, more inexpensive package which requires less power for the production of the drive field. In addition, since the magnetic bubble domain chips are located external to the drive field coil assembly, a larger number of chips can be included in the package without increasing the size of or power required for the drive field coils, and chip repair during manufacture is facilitated since the coils need not be disassembled to reach the chip. A magnetic bias field assembly is provided and includes an open-ended tubular housing which is constructed of shielding material to shunt stray magnetic fields external to the package, permanent magnets mounted inside the housing, and soft magnetic spreader plates secured to the magnets which insure field uniformity. Convenient electrical access to the magnetic bubble domain chip is acquired by means of external signal leads extending from the open ends of the housing, while the design of the housing and the magnet structure therein maintains a predetermined magnetic environment for the chip. The chip/drive field coil assembly is secured within the bias field assembly by means of a suitable encapsulating operation, which insures the integrity and structural rigidity of the final package. Other objects and features will be in part apparent and in part pointed out hereinafter.

DETAILED DESCRIPTION OF THE INVENTION

Figure 1:
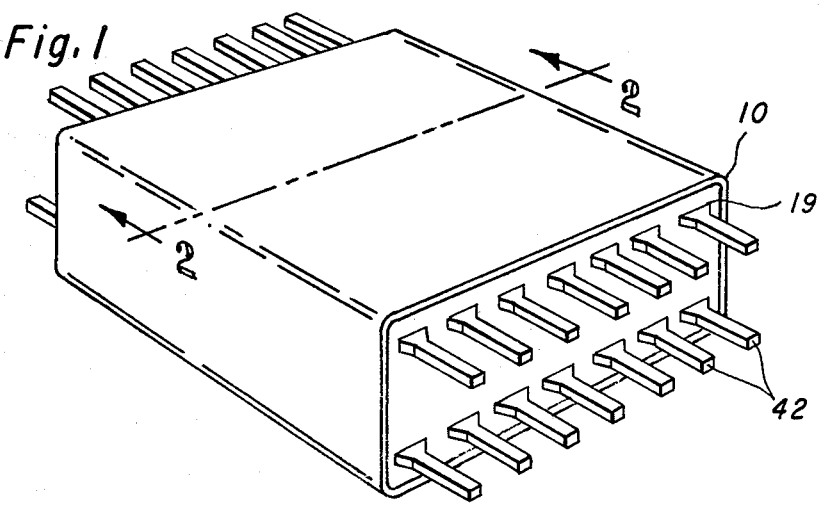
FIG. 1 is a perspective view of a completed magnetic bubble domain package relating to the preferred embodiment of this invention.
Figure 2:
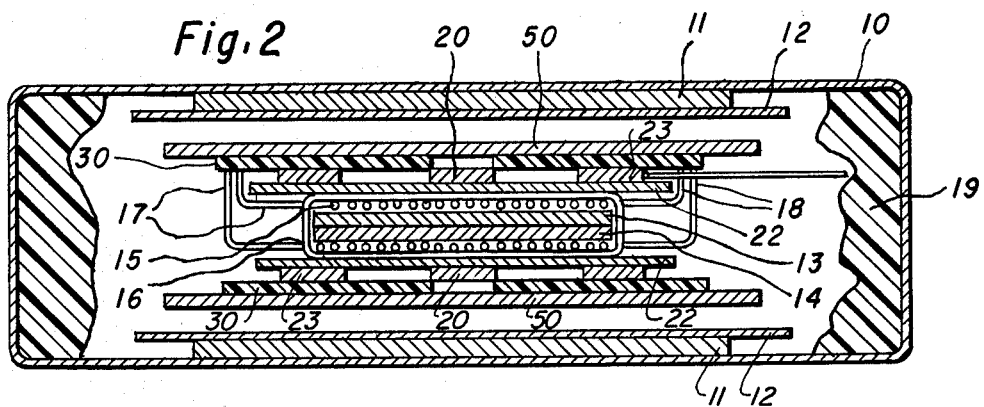
FIG. 2 is a cross-sectional view taken along the section line 2—2 of FIG. 1.

Referring more specifically to the drawings, FIGS. 1 and 2 illustrate a magnetic bubble domain package in accordance with a preferred embodiment of this invention. FIG. 2 is a cross-sectional view which shows the various subassemblies of the package and the structural relationships therebetween. The package is enclosed by an open-ended tubular housing, 10, which has plates of permanent magnet material, 11, secured to opposite inner faces thereof. The permanent magnet plates 11 have plates of soft magnetic material, 12, secured thereto for improving the uniformity of the magnetic bias field produced by permanent magnet plates 11. The assembly secured within housing 10 and centrally located between soft magnetic plates 12 is comprised of a pair of magnetic bubble domain chip subassemblies located in parallel spaced-apart relationship on opposite sides of the external drive field coil subassembly. The coil subassembly is located at the geometric center of the package and generally comprises a core of magnetic material formed by plates of soft magnetic material 13 and 14, a first, or inner coil 15 wound around the magnetic core, and a second, or outer coil 16 wound around the inner coil in orthogonal relationship thereto. Each magnetic bubble domain chip subassembly generally comprises a chip support plate 22, a spacer frame 23 secured to the chip support plate, and a magnetic bubble domain chip 20 secured to the chip support plate within spacer frame 23. The bonding areas of magnetic bubble domain chip 20 are electrically connected to a pattern of conductors disposed on an interconnect member 30 which facilitates electrical access to the magnetic bubble domain chip after encapsulation. A metal plate 50 is located in spaced parallel relationship to magnetic bubble domain chip 20 and is operably associated therewith in order to improve the uniformity of the magnetic field produced by the drive field coil subassembly. The structure located centrally within housing 10 is encapsulated therein by means of a body of insulative molding material, 19, and electrical access to the magnetic bubble domain chips 20 is assured by means of signal leads 42, which are bonded to the pattern of conductors disposed on interconnect member 30 before encapsulation. It is understood that, although two chip subassemblies are included in the structure of FIG. 2, the package may be constructed as a single chip assembly within the spirit of the present invention.

Open-ended tubular housing 10 may be composed of a suitable shielding material, a 78% nickel, 22% iron composition being one example thereof. Housing 10 has a substantially rectangular cross-section, the top and bottom sides of the housing forming the longer sides of the rectangle. Housing 10, although open at both ends, effectively shunts stray magnetic fields in the operating environment of the magnetic bubble domain device in order to maintain a predetermined magnetic environment within the package. Secured to the top and bottom inner surfaces of housing 10 are plates 11 of permanent magnetic material. Plates 11 are substantially rectangular, and one of the enlarged major surfaces of each plate is secured to the inner surface of housing 10 with epoxy or any other suitable adhesive so that plates 11 are parallel and in general registry with each other across the inner volume of housing 10. Plates 11 may be constructed of any suitable permanent magnet material, Indox being one example thereof, and produce a magnetic field in a direction perpendicular to the plane of the major surfaces of the plates through the inner volume of housing 10, the strength of this field depending on the magnetization of the permanent magnet plates 11. A bias spreader plate 12, composed of a soft magnetic material, is secured, using epoxy or any other suitable adhesive, to each plate of permanent magnet material 11 along the enlarged major surface of plate 11 opposite the enlarged major surface by which plate 11 is secured to the inner surface of housing 10. Spreader plates 12 are substantially rectangular and dimensionally larger than plates 11, so that spreader plates 12 entirely cover the surfaces of plates 11 and are positioned parallel and in general registry with each other across the inner volume of housing 10. Spreader plates 12 may be of any suitable soft magnetic material, such as silicon steel or soft ferrite, for example, and serve to increase the uniformity of the perpendicular bias field produced by permanent magnet plates 11, spreader plates 12 being magnetizable, thus spreading the flux lines of the permanent magnets over a greater surface area. This bias field structure thus produces an extremely uniform magnetic field perpendicular to the plane of the magnets 11. This bias field structure may be constructed separately as a component and the inner structure of the package, which includes the magnetic bubble domain chip or chips, the interconnect member or members associated therewith, and the drive field coil subassembly, may then be inserted into the bias field structure in a separate manufacturing operation. The various components comprising this inner structure of the package will now be described in more detail.

Figure 3:
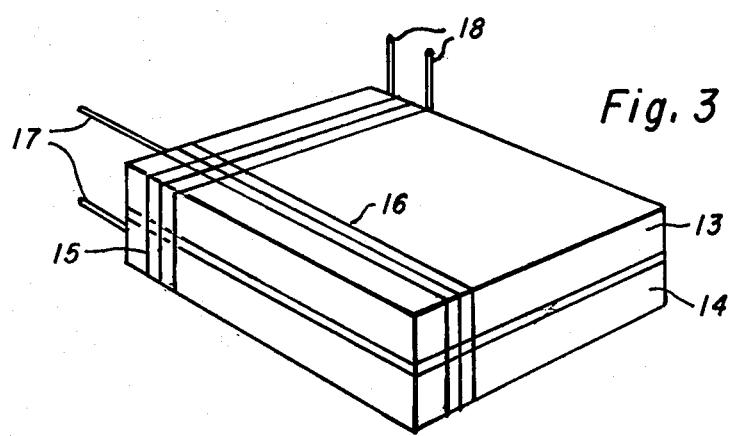
FIG. 3 is a perspective view of the drive field coil assembly used in the preferred embodiment of this invention.

The drive field coil subassembly, which is located at the geometric center of the package and which is used to produce the rotary magnetic field necessary to manipulate the magnetic bubbles within the film of magnetizable material disposed on the surface of the magnetic bubble domain chip or chips, is shown in FIG. 3. The drive field coil subassembly generally comprises a pair of soft magnetic plates 13 and 14 forming a segmental core and a pair of orthogonally related coils wound thereabout. Plates 13 and 14, which may be of soft ferrite material, for example, are substantially rectangular and are secured to each other with epoxy or any other suitable adhesive, the enlarged major surfaces of the plates being disposed against each other in a contiguous parallel relationship. The pair of orthogonally related coils includes a first, or inner coil 15 composed of insulated magnet wire wound around plates 13 and 14 and a second, or outer coil 16, also of insulated magnet wire, wound around and in orthogonal relationship to inner coil 15. The free ends of coils 15 and 16 respectively form drive wires 17 and 18 by which the coils 15 and 16 may be energized. The signals for drive field coils 15 and 16, which are supplied by drive wires 17 and 18, respectively, are sinusoidal signals which are 90° out of phase with each other. This energization of the coils wound orthogonally on the segmented magnetic body or core defined by the plates 13 and 14 of soft magnetic material produces a rotary magnetic field in the general area surrounding the coil assembly. It is understood that, although the magnetic body of the drive field coil subassembly has been described as segmental, and although this segmental configuration may offer some advantages relating to the uniformity of the magnetic field produced by the subassembly, a single plate of soft magnetic material could be used to form the magnetic body for the drive field coil subassembly.

Figure 4:
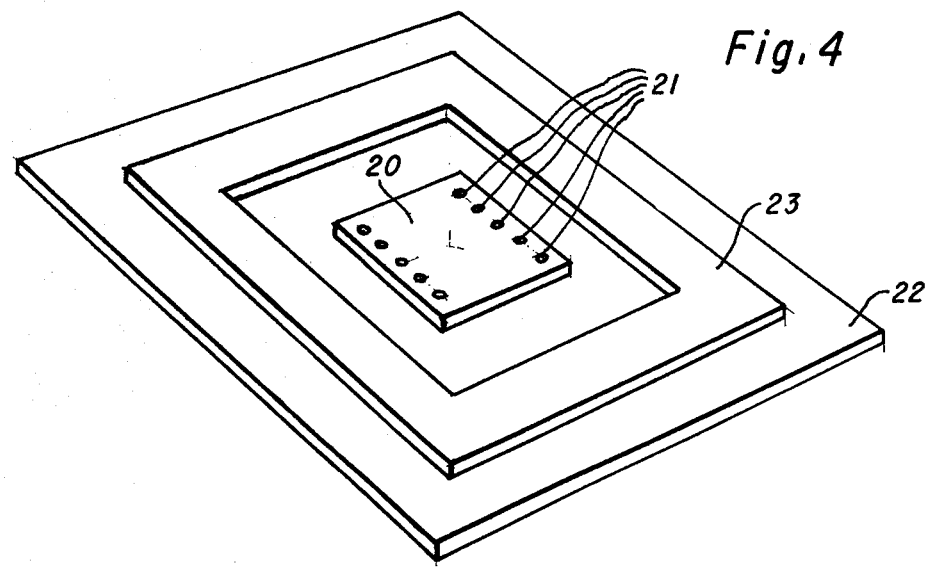
FIG. 4 is a perspective view of the chip means component relating to the preferred embodiment of this invention.

Referring to FIG. 4, a magnetic bubble domain chip subassembly as used in the preferred embodiment of this invention is shown. The subassembly generally comprises a chip support plate 22, a spacer frame 23 secured to chip suppOrt plate 22, and a magnetic bubble domain chip 20 secured to chip support plate 22 within spacer frame 23. Magnetic bubble domain chip 20 comprises a thin film of bubble-supporting magnetic material disposed on a substrate of non-magnetic material and an overlay pattern of magnetizable material disposed on the bubble-supporting film. The magnetic film has magnetically easy directions essentially perpendicular to the plane of the film, so that a perpendicular magnetic bias field may form small localized regions of polarization aligned opposite to the general polarization direction. Such localized regions are called magnetic bubble domains, and are of generally cylindrical configuration. The magnetic bubble domains may be manipulated along the overlay pattern with a magnetic drive field rotating in the plane of the bubble-supporting film of the chip. The bubble domains may thus be used to perform logical operations. These operations are controlled by circuitry external to the chip, the signals for these operations being supplied by conductors bonded to the overlay pattern on the chip via bonding areas 21, which are also disposed on the bubble supporting magnetic film of the chip. The substrate of magnetic bubble domain chip 20 is secured, with epoxy or any other suitable adhesive, to a substantially rectangular chip support plate 22, which is dimensionally larger than chip 20, so that marginal end portions of plate 22 extend beyond the periphery of chip 20. A spacer frame 23 is also secured to chip support plate 22 with epoxy or any other suitable adhesive. Spacer frame 23 is substantially rectangular, dimensionally smaller than chip support plate 22, and contains a rectangular window within which the magnetic bubble domain chip 20 is positioned. Spacer frame 23 is secured to the marginal end portions of chip support plate 22 to form the chip subassembly of FIG. 4, frame 23 being of approximately the same thickness as magnetic bubble domain chip 20. Both the chip support plate 22 and spacer frame 23 may be part of the chip substrate or may be components constructed of any suitable non-conducting material, ceramic aluminum oxide (Al$_2$O$_3$) being one example thereof. As shown in FIG. 2, the chip subassembly of FIG. 4 is secured to the drive field coil subassembly of FIG. 3 such that the magnetic bubble domain chip 20 is located in the vertical center of the drive field coils where the rotating magnetic drive field is most uniform, the bottom of chip support plate 22 being secured to outer coil 16 with epoxy or some other suitable adhesive. As mentioned in the discussion of FIG. 2, the packaging assembly of FIGS. 1 and 2 may be constructed as a single chip package assembly within the scope of the present invention wherein only one of the chip subassemblies shown in FIG. 4 is employed in conjunction with the drive field coil subassembly.

Figure 5:
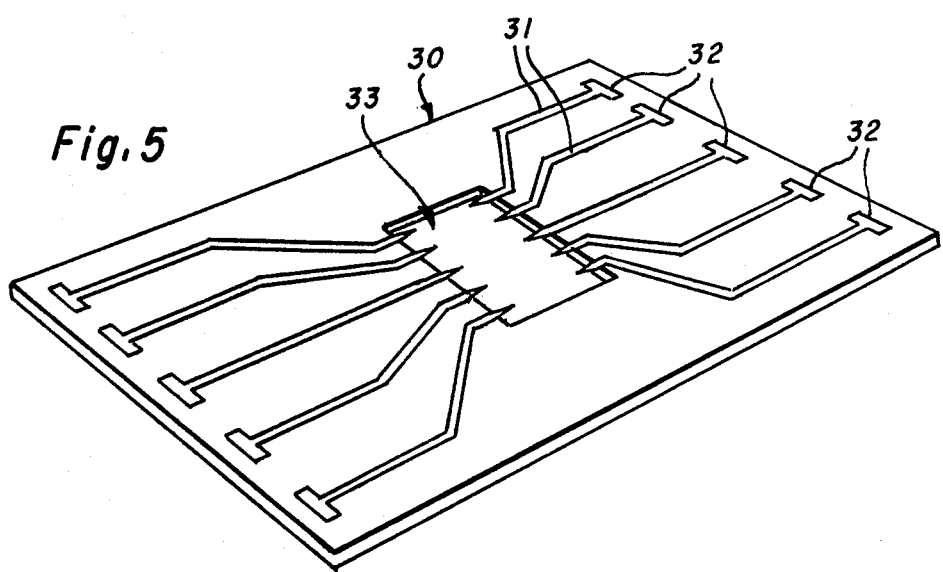
FIG. 5 is a perspective view of the interconnect member used to gain electrical access to the magnetic bubble domain chip in the preferred embodiment of this invention.

Convenient electrical access to magnetic bubble domain chip 20 is assured by means of an interconnect member 30, an enlarged perspective view of one embodiment of which is shown in FIG. 5. An elongated rectangular plate of non-magnetic insulating material is formed to contain chip aperture 33, the dimensions of aperture 33 substantially matching those of magnetic bubble domain chip 20. Disposed on this elongated rectangular plate is a pattern of conductors 31, which are fabricated to include conducting lead connecting pads 32 along the narrower outer edges of interconnect member 30. Metal conductors 31 are disposed substantially parallel on the surface of interconnect member 30 from lead connecting pads 32 to chip aperture 33 and overhanging into the aperture. Conductors 31 may be composed of any suitable conducting metal, copper being one example thereof. Conductors 31 are plated, using a suitable electroplating technique, with a metal, the melting temperature of which is sufficiently low so as to permit its use as a solder in subsequent bonding operations. Tin is a suitable metal for this purpose. The insulating material used for interconnect member 30 may be composed of the Kapton polyimide plastic film, marketed by the E. I. DuPont Company of Wilmington, Del. used in the semiconductor device of U.S. Pat. No. 3,859,718. The top of interconnect member 30 is positioned over magnetic bubble domain chip 20 as shown in FIG. 2 so that bonding areas 21 of the chip and overhanging terminals of conductors 31 contact each other and are electrically connected by means of a bonding tool inserted through aperture 33. Interconnect member 30 is attached, using epoxy or some other suitable adhesive, to spacer frame 23 to insure structural rigidity.

Figure 6:
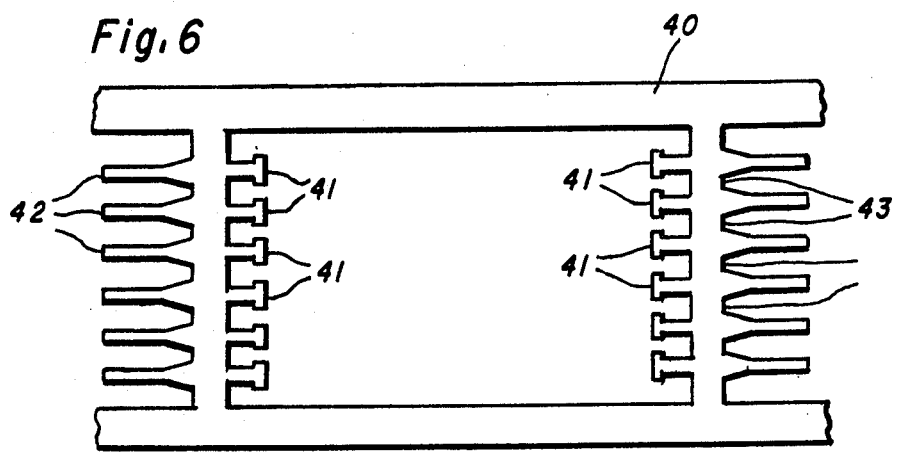
FIG. 6 is a plan view of a lead frame used to support the external signal leads in the preferred embodiment of this invention.

The lead frame 40, shown in FIG. 6, is substantially similar to that used in U.S. Pat. No. 3,859,718. It is formed to contain inner lead ends 41 and external signal leads 42. It consists of a metal alloy, copper being one example thereof, plated with a metal, the melting temperature of which is sufficiently low so as to permit its use as a solder in subsequent bonding operations. Tin is a suitable metal for this purpose. Inner lead ends 41 contact lead connecting pads 32 on the interconnect member 30 and are bonded thereto using a suitable bonding technique. Tie bars 43 are trimmed from lead frame 40 after bonding operations are completed, and electrical access to the chip is then possible through external signal leads 42. Drive wires 17 and 18 are bonded to four of these leads so that coil excitation signals may be provided through the external signal leads after the package is encapsulated.

Metal plate 50, shown in FIG. 2, is secured to the bottom of insulating film intercOnnect member 30 using epoxy or some other suitable adhesive. Metal plate 50 may be composed of any suitable metal conductor, copper being one example thereof, and is of substantially rectangular shape. Metal plate 50 thus covers the chip aperture 33 in interconnect member 30 and is suspended away from the bubble-supporting surface of magnetic bubble domain chip 20 a distance equalling the thickness of interconnect member 30. Metal plate 50 enhances and shapes the magnetic field produced by the drive field coil subassembly, an image current being induced in plate 50 by the AC field of drive coils 15 and 16 through chip aperture 33. Because the magnetic bubble domain chip 20 is located external to the drive field coils in this invention, metal plate 50 is required to insure the uniformity of the drive field normally guaranteed by locating the chip inside the coil.

The central structure of the package is permanently encapsulated within housing 10 by means of a suitable molding operation, wherein a body of molding material 19 is inserted into the open ends of housing 10 to insure the integrity and structural rigidity of the final package. Molding material 19 may be any suitable insulating material, such as the advanced Novalac epoxy used in the construction of the device of U.S. Pat. No. 3,859,718. As shown in FIG. 1, signal leads 42 extend from the open ends of housing 10 through molding material 19, so that signals to and from the magnetic bubble domain chips and excitation signals for the drive field coil subassembly are conveniently provided through the shielded, encapsulated final package.

Figure 7:
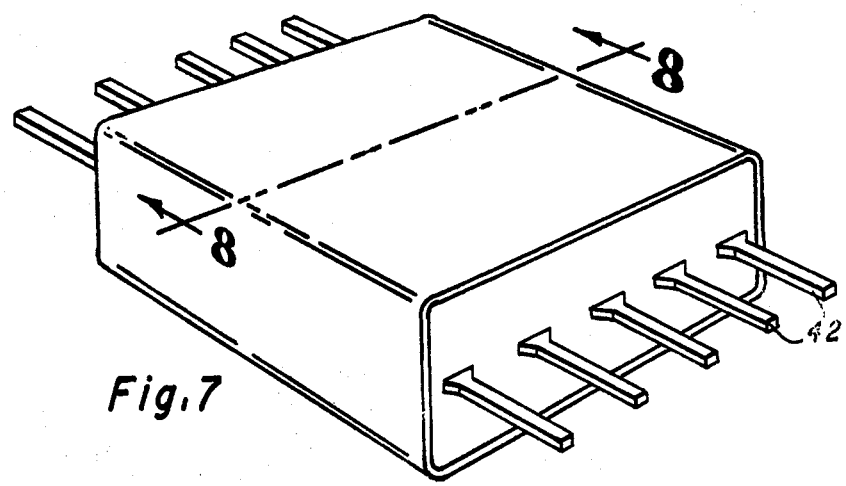
FIG. 7 is a perspective view of the completed magnetic bubble domain package relating to a second embodiment of this invention.
Figure 8:
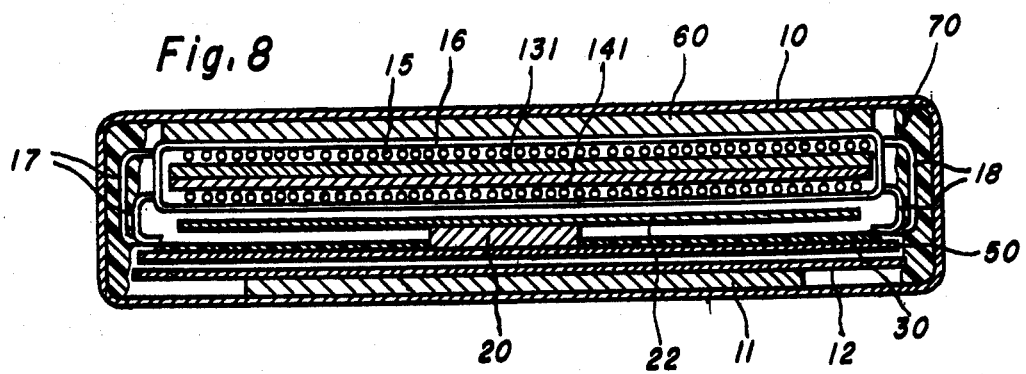
FIG. 8 is a cross-sectional view taken along the section line 8—8 of FIG. 7.

FIGS. 7 and 8 illustrate a magnetic bubble domain package in accordance with a second embodiment of this invention. It is seen that the embodiment of FIG. 8 is substantially similar in construction to the preferred embodiment of FIG. 2. As in the preferred embodiment, the package is enclosed by an open-ended tubular housing 10. A plate of permanent magnet material 11 and a plate of soft magnetic material 12 are secured to the bottom inner surface of housing 10 as in the first embodiment. A metal plate, 60, is secured to the top inner surface of housing 10 in this embodiment, however, and the drive field coil subassembly is secured to metal plate 60. As in the first embodiment, the magnetic bubble domain chip subassembly, which is located centrally within housing 10, is encapsulated within the housing by means of an insulative molding material 70, and signals for the magnetic bubble domain chip 20 and the drive field cOil subassembly are provided by signal leads 42, which extend from the open ends of the final encapsulated package.

Metal plate 60 is substantially rectangular and is secured, using epoxy or any other suitable adhesive, to one of the inner surfaces of tubular housing 10 along one of its enlarged major surfaces. As in the preferred embodiment, a rectangular plate of permanent magnet material 11 is secured to the opposite inner surface of housing 10 and a rectangular spreader plate 12 of soft magnetic material is secured to plate 11. In the drive field coil subassembly for this embodiment, first and second plates 131 and 141, are secured to each other, using epoxy or any other suitable adhesive along enlarged major surfaces thereof, so that the plates are disposed against each other in contiguous parallel relationship. Plate 131 is constructed of any suitable permanent magnet material, Indox for example, and plate 141 is constructed of any suitable soft magnetic material, such as soft ferrite. Inner and outer coils 15 and 16 are wound around this magnetic core in orthogonal relationship with respect to each other as in the first embodiment, excitation signals for coils 15 and 16 being supplied by drive wires 17 and 18 as in the first embodiment. Drive wires 17 and 18 are bonded to signal leads 42 as in the first embodiment before encapsulation of the device. This drive field coil subassembly is secured to the enlarged major surface of metal plate 60 with epoxy or any other suitable adhesive. Metal plate 60 is included in order to reduce the coil loss which would otherwise result from the contact of the drive field coil subassembly with housing 10. Permanent magnet plate 131 cooperates with soft magnetic plate 141 to form the top half of the bias field structure, so that plates 131 and 141 perform substantially the same function as plates 11 and 12 in the embodiment of FIG. 2. This embodiment thus has the added advantage of utilizing the drive field coil subassembly as part of the bias field structure, which eliminates part of the magnetic structure, thus reducing the expense and weight of the final package.

Although the embodiments of FIGS. 2 and 8 indicate that the central structure of the package is located within housing 10 in an exact parallel relationship with respect to the plates of permanent magnet material 11 to facilitate the illustration of the invention, it will be understood that the central structure of the package may be encapsulated therein at a slight angle with respect to the permanent magnets in order to obtain a tilt field for more reliable stop/start operation of the device.

As various changes in addition to those mentioned could be made to the structures described without departing from the scope of the invention, it is intended that all matter contained in the above description and shown in the accompanying drawings shall be interpreted as illustrative and not in a limiting sense.

What is claimed is:

1. A magnetic bubble domain chip packaging assembly comprising:
    at least one magnetic bubble domain chip,
    a pair of magnetic field-producing coils including a first inner coil having a plurality of turns of substantially uniform size and a second outer coil having a plurality of turns of substantially uniform size, said outer coil being wound about said inner coil in orthogonal relationship with respect thereto and cooperating therewith to encompass a volumetric space therewithin,
    said magnetic bubble domain chip being located externally with respect to said pair of magnetic field-producing coils and said volumetric space encompassed thereby,
    interconnect means operably connected to said magnetic bubble domain chip and providing external electrical access to said chip for enabling selected bubble functions to occur on said chip in accomplishing data processing operations,
    bias field magnetic means operably associated with said magnetic bubble domain chip for producing a magnetic bias field essentially perpendicular to said chip,
    a body of insulating material encapsulating said magnetic bubble domain chip, said pair of magnetic field-producing coils, and said interconnect means, and
    signal leads extending outwardly from said insulating body, said signal leads being electrically connected to said interconnect means and to said pair of magnetic field-producing coils for providing input and-/or output signals to and/or from said magnetic bubble domain chip and excitation signals to said coils.

2. A magnetic bubble domain chip packaging assembly as set forth in claim 1, further including a second magnetic bubble domain chip encapsulated in said body of insulating material, said second magnetic bubble domain chip being located externally with respect to said pair of magnetic field-producing coils and said volumetric space encompassed thereby on the opposite side thereof from the first magnetic bubble domain chip.

3. A magnetic bubble domain chip packaging assembly comprising:
    a non-conductive plate, at least one magnetic bubble domain chip disposed on said non-conductive plate, said chip comprising a non-magnetic substrate, a film of magnetizable material capable of supporting magnetic bubble domains disposed on said substrate, and a plurality of bonding areas disposed on said film of magnetizable material, a pair of magnetic field-producing coils including a first inner coil having a plurality of turns of substantially uniform size and a second outer coil having a plurality of turns of substantially uniform size, said outer coil being wound about said inner coil in orthogonal relationship with respect thereto and cooperating therewith to encompass a volumetric space therewithin, said magnetic bubble domain chip being located externally with respect to said pair of magnetic field-producing coils and said volumetric space encompassed thereby, interconnect means electrically connected to said bonding areas of said magnetic bubble domain chip and providing external electrical access to said chip for enabling selected bubble functions to occur on said chip in accomplishing data processing operations, bias field magnetic means operably associated with said magnetic bubble domain chip for producing a magnetic bias field essentially perpendicular to said chip, a body of insulating material encapsulating said non-conductive plate, said magnetic bubble domain chip, said pair of magnetic field-producing coils, and said interconnect means, and signal leads extending outwardly from said insulating body, said signal leads being electrically connected to said interconnect means and to said pair of magnetic field-producing coils for providing input and-/or output signals to and/or from said magnetic bubble domain chip and excitation signals to said coils.

4. A magnetic bubble domain chip packaging assembly as set forth in claim 3, further including magnetic core means for said pair of magnetic field-producing coils, said magnetic core means being disposed within said volumetric space encompassed by said pair of magnetic field-producing coils.

5. A magnetic bubble domain chip packaging assembly as set forth in claim 4, wherein said magnetic core means comprises first and second plates of soft magnetic material having major surfaces disposed against each other in contiguous parallel relationship.

6. A magnetic bubble domain chip packaging assembly as set forth in claim 4, wherein said magnetic core means comprises a first plate of permanent magnetic material and a second plate of soft magnetic material having major surfaces disposed against each other in contiguous parallel relationship.

7. A magnetic bubble domain chip packaging assembly as set forth in claim 3, further including a non-conductive spacer frame mounted on said non-conductive plate, and said magnetic bubble domain chip being disposed on said non-conductive plate in substantially centered relationship within said spacer frame.

8. A magnetic bubble domain chip packaging assembly as set forth in claim 3, further including a magnetic field-shaping conductive metal plate disposed on said interconnect means in spaced parallel relation to said magnetic bubble domain chip and in generally parallel relationship to said pair of magnetic field-producing coils for enhancing the uniformity of the magnetic field provided therefrom.

9. A magnetic bubble domain chip packaging assembly as set forth in claim 3, wherein said interconnect means comprises a plate of non-magnetic insulating material having a centrally located aperture provided therein, and a plurality of metal conductors disposed on said non-magnetic insulating plate on the surface thereof opposite from said magnetic bubble domain chip, said conductors including respective terminal end portions overhanging into the aperture in said non-magnetic insulating plate, and said overhanging terminal end portions of said conductors being electrically connected to said plurality of bonding areas disposed on the film of magnetizable material of said magnetic bubble domain chip.

10. A magnetic bubble domain chip packaging assembly as set forth in claim 3, wherein said bias field magnetic means comprises a tubular housing of shielding material for shunting stray magnetic fields disposed about said body of insulating material, first and second permanent magnet members mounted within said tubular housing on respective planar inner surfaces thereof so as to be disposed in opposed relationship with respect to each other and with said magnetic bubble domain chip, said pair of magnetic field-producing coils, and said interconnect means being located therebetween, and first and second magnetizable members of soft magnetic material disposed respectively on said first and second permanent magnet members in spaced relation with respect to said housing.

11. A magnetic bubble domain chip packaging assembly as set forth in claim 3, wherein said bias field magnetic means comprises a tubular housing of shielding material for shunting stray magnetic fields disposed about said body of insulating material, a metal plate within said housing and disposed on an internal surface thereof, said pair of magnetic field-producing coils being mounted on said metal plate, a permanent magnet member within said housing and disposed on an internal surface thereof in opposed relationship to said metal plate, a magnetizable member of soft magnetic material disposed on said permanent magnet member in spaced relation to said housing, and said non-conductive plate with said magnetic bubble domain chip mounted thereon being located within said housing between said pair of magnetic field-producing coils and said magnetizable member of soft magnetic material in spaced substantially parallel relationship thereto.

12. A magnetic bubble domain chip packaging assembly comprising:
first and second magnetic bubble domain chip subassemblies disposed in parallel spaced apart relationship with respect to each other, each of said chip subassemblies including
a non-conductive plate and a magnetic bubble domain chip disposed thereon,
interconnect means operably connected to said chip and providing external electrical access to said chip for enabling selected bubble functions to occur on said chip in accomplishing data processing operations, and
a metal plate disposed on said interconnect means in spaced parallel relation to said magnetic bubble domain chip;
a pair of magnetic field-producing coils disposed between said first and second chip subassemblies, said pair of magnetic field-producing coils including a first inner coil having a plurality of turns of substantially uniform size and a second outer coil having a plurality of turns of substantially uniform size, said outer coil being wound about said inner coil in orthogonal relationship with respect thereto and cooperating therewith to encompass a volumetric space therewithin;

bias field magnetic means operably associated with said first and second chip subassemblies and including first and second bias field structures respectively associated with said first and second chip subassemblies, each of said bias field structures comprising a permanent magnet member and a magnetizable member of soft magnetic material disposed thereon in spaced opposed relationship to the chip subassembly corresponding thereto;

a body of insulating material encapsulating said first and second chip subassemblies, said pair of magnetic field-producing coils, and said magnetizable members of soft magnetic material included in said first and second bias field structures;

a tubular housing of shielding material for shunting stray magnetic fields extending about said body of insulating material;

said permanent magnet members of said first and second bias field structures being respectively mounted on opposed internal surfaces of said tubular housing; and signal leads extending outwardly from said insulating body at the opposite ends of said tubular housing, said signal leads being electrically connected to said interconnect means of said first and second chip subassemblies and to said pair of magnetic field-producing coils for providing input and/or output signals to and/or from said magnetic bubble domain chips and excitation signals to said coils.

* * * * *